United States Patent [19]

Ponto et al.

[11] 4,374,300

[45] Feb. 15, 1983

[54] SOUND MIXER DEVICES

[75] Inventors: Robert Ponto; Hardison G. Martin, both of Louisville, Ky.

[73] Assignee: Innovative Electronics, Inc., Louisville, Ky.

[21] Appl. No.: 85,905

[22] Filed: Oct. 18, 1979

[51] Int. Cl.³ .............................................. H04M 1/60
[52] U.S. Cl. ............................... 179/1 AT; 179/1 CN
[58] Field of Search ................. 179/1 AT, 1 B, 1 CN, 179/1 VC, 1 VL

[56] References Cited

U.S. PATENT DOCUMENTS

| 3,755,625 | 8/1973 | Maston | 179/1 CN |
| 3,992,584 | 11/1976 | Dugan | 179/1 AT |
| 4,090,032 | 5/1978 | Schrader | 179/1 CN |
| 4,139,731 | 2/1979 | Hashemi et al. | 179/1 CN |
| 4,149,032 | 4/1979 | Peters | 179/1 AT |

Primary Examiner—Bernard Konick
Assistant Examiner—J. A. Popek
Attorney, Agent, or Firm—Edward M. Steutermann

[57] ABSTRACT

A multiple program input audio system including a plurality of input channels each adapted to provide an output program signal. Each channel comprises an actuator which compares a rectified program signal with a reference signal and generates an actuator output signal when the rectified signal is greater than the reference signal. A zero crossing detector also receives the program signal and generates an initiator pulse when the voltage of the program signal is zero. A master control switch receives the actuator output signal and generates a first master control output signal when pulsed by the initiator pulse and generates a second master control output signal when no signal is received from the actuator. A program switch receives the program signal and in response to the first master control output signal applies the program signal to an audio program buss where the program signals from all the channels are summed and applied to a digital attenuator. The second master control output signals are summed from all the channels and applied to the attenuator so that the output of the attenuator is a combined program signal attenuated in proportion to the total number of actuated input channels.

10 Claims, 8 Drawing Figures

SOUND MIXER DEVICES

BACKGROUND OF THE INVENTION

The present invention relates to multiple input audio systems, for example public address or sound systems which are useful in large meeting halls or in any application where multiple source communication is necessary and where several microphones are used to provide a combined output signal.

Prior arrangements are known where the individual microphone circuits to the output are sound activated by a sound program provided to the individual microphone.

In some arrangements, the output signal level is attenuated by the number of active inputs and in other instances no attenuation is provided. One such arrangement is shown in a booklet entitled "Field Effect Transistor Projects" published by Motorola, Inc. (TM) Phoenix, Ariz. (1966).

Examples of arrangements where the output is modified by the number of active inputs are shown in U.S. Pat. No. 3,814,856 Dugan wherein a sound reinforcement system for a defined area is disclosed having a plurality of input channels and input program sources. In this arrangement, the ambient noise level in the area served by the sound system is sensed and a reference signal is generated in response to the ambient noise level which is used as a reference signal to control the signal proportional to the ambient noise where the combined output signal is then supplied to a comparator for comparison with the reference signal. In this arrangement, a feedback system is provided around the comparator to maintain the access of the input channel to the output. The reference also provides an output system having a variable gain amplifier means where the gain is boosted inversely proportional to the square root of the number of active inputs. While the arrangement is satisfactory in many applications it requires continuous monitoring of the ambient noise level for reference purposes so that such devices are not useful where no accurate ambient noise level can be obtained. Furthermore, devices in accordance with the reference provide an arrangement where the reference signal bears no relation to the number of activated input channels and where localized ambient noise can preclude activation of the input channel.

In this regard, it will be noted that the arrangements in accordance with the reference boost the sum of all the active information channels by an amount proportional to the magnitude of the control signal, regardless of the number of active input channels.

Another prior art arrrangement is shown in U.S. Pat. No. 3,992,584 Dugan, which discloses a sound reinforcement system with a plurality of inputs to an output channel, where the total gain of the system remains constant.

In the arrangement disclosed in U.S. Pat. No. 3,992,584 the individual input channels are actuated by co-action between a reference signal which is proportional to the instantaneous sum of the alternating current signals generated by the active input channels. In addition, the alternating current signal is also filtered and rectified to provide direct current reference signal to be compared with the filtered and rectified output signal of each input channel to selectively activate the input channel.

The use of summed alternating current inputs for a reference signal leads to distortion in the system output as a result of phase cancellation which occurs in the summation of the alternating current reference signals. The distortions are disturbing and adversely affect the effectiveness of the system.

Additionally, since the reference (U.S. Pat. No. 3,992,584) provides an arrangement where each input channel includes a control and where the channel attenuation is achieved by means of a comparative summing amplifier with the summing amplifier as a reference signal, and a direct current signal generated from the output of the microphone, the distortion occasioned by the frequency interference is mixing the signals is significant. This is particularly true since the attenuation of each input channel is responsive to the magnitude of the compared signal as opposed to a switched system. In many applications, the inbalance resulting from the summation of alternating current signals limits responsiveness of the input channel and causes distortion in the system output.

While the foregoing systems have proven satisfactory in certain applications, they present the problems of distortion, or "dead spots", in certain applications and are unsuitable in other applications.

In copending application Ser. No. 4,195, filed Jan. 17, 1979, now abandoned, and arrangement is disclosed providing a multiple source sound amplifying and activation system including at least one first microphone means to generate first sound input signal and at least one second microphone means to generate a second source input signal, at least one input channel means for each microphone means, each input channel means including source input signal filter means to receive a source input signal and transmit a portion of the source input signal as a filtered input signal to full wave rectifier means to provide a full wave rectified direct current channel input signal of selected polarity summing means to receive the direct current input signals from each of the input channel means and to provide a direct current reference signal proportional to the sum of a full wave rectified direct current source input signals received by the summing means input channel comparator means for each input channel to receive and compare the reference signal with the full wave rectified direct current source signal of the input channel and having an output operable to provide a first control signal in response to a first ratio between the reference signal and the direct current channel input source signal and a second control signal in response to a second ratio between the reference signal and the direct current channel input source signal, input signal amplifier means for each input channel to receive the source input signal from the microphone means to transmit an amplified source input signal to output amplification means, where the input signal amplifier means is operable in response to the first control signal and inoperable in response to the second control signal, multiple channel output means including output signal summing means adapted to receive the amplified source input signal from the input signal amplifier means of each activated input channel and attenuator means to receive the output signal from the output signal summing means and having input means to receive the first and second control signals from each of the input channel comparator means of each of the input channels where the attenuator means attenuates the output signal from the output signal summing means in response to the number of first signals received from the input channel comparator means.

In normal operation without compensation, the use of multiple channel inputs to a single output speaker system a disconcerting noise will accompany activation of each channel. To overcome this disadvantage, prior systems have introduced means, for example cooperative resistance, capacitance circuits to slow the rise of a signal level in the output of the newly activated or deactivated input channel. While such arrangements can be adapted to effectively eliminate distortion the benefit is achieved at the sacrifice of responsiveness and such systems can be relatively expensive.

SUMMARY OF THE INVENTION

The present invention provides a sound system to provide multiple program input channels to at least one common amplified output.

Devices in accordance with the present invention are particularly useful in that the actuation of one input does not cause distortion of the output, and the benefits are achieved without the need for delay or slowing the rise rate of transmission of the new input signal.

Moreover, devices within the scope of the present invention can be manufactured at less expense than devices utilized previously and are more dependable.

It has been found as explained in copending application Ser. No. 4,195, previously referred to, improved attenuation for multiple input sound systems can be achieved by conversion of program input signals to direct current actuation signals and summing such signals to provide a reference signal for gating new program inputs. In other arrangements, alternating current signals are utilized to provide the reference signals for gating new input programs. It will be recognized that devices within the scope of the present invention can be utilized with either method.

Briefly, the present invention provides an arrangement where the alternating current program input signal is provided to control means which actuates the program output at "0" crossing of the program signal so that there is no interfering distortion when the new signal is introduced to the output.

Briefly the present invention provides multiple program input audio system including multiple input channels each adapted to receive a program signal and provide an actuator signal and a output program signal where each input channel includes actuator output signal, input channel master control switch means to receive the actuator output signal to provide first and second master control output signals, program switch means to receive the program signal and selectively operable first master control signal where the program switch provides program output signal upon actuation by the first master control signal, "0" crossing detector means to receive the program signal to provide actuator pulse to the master control switch to permit actuation of the program switch at the point where the voltage of the program signal is "0".

The present invention is described with reference to the example shown in the accompanying figures but it will be recognized that other arrangements and applications within the scope of the present invention will occur to those skilled in the art upon reading the disclosure set forth herein where:

Figure 1:
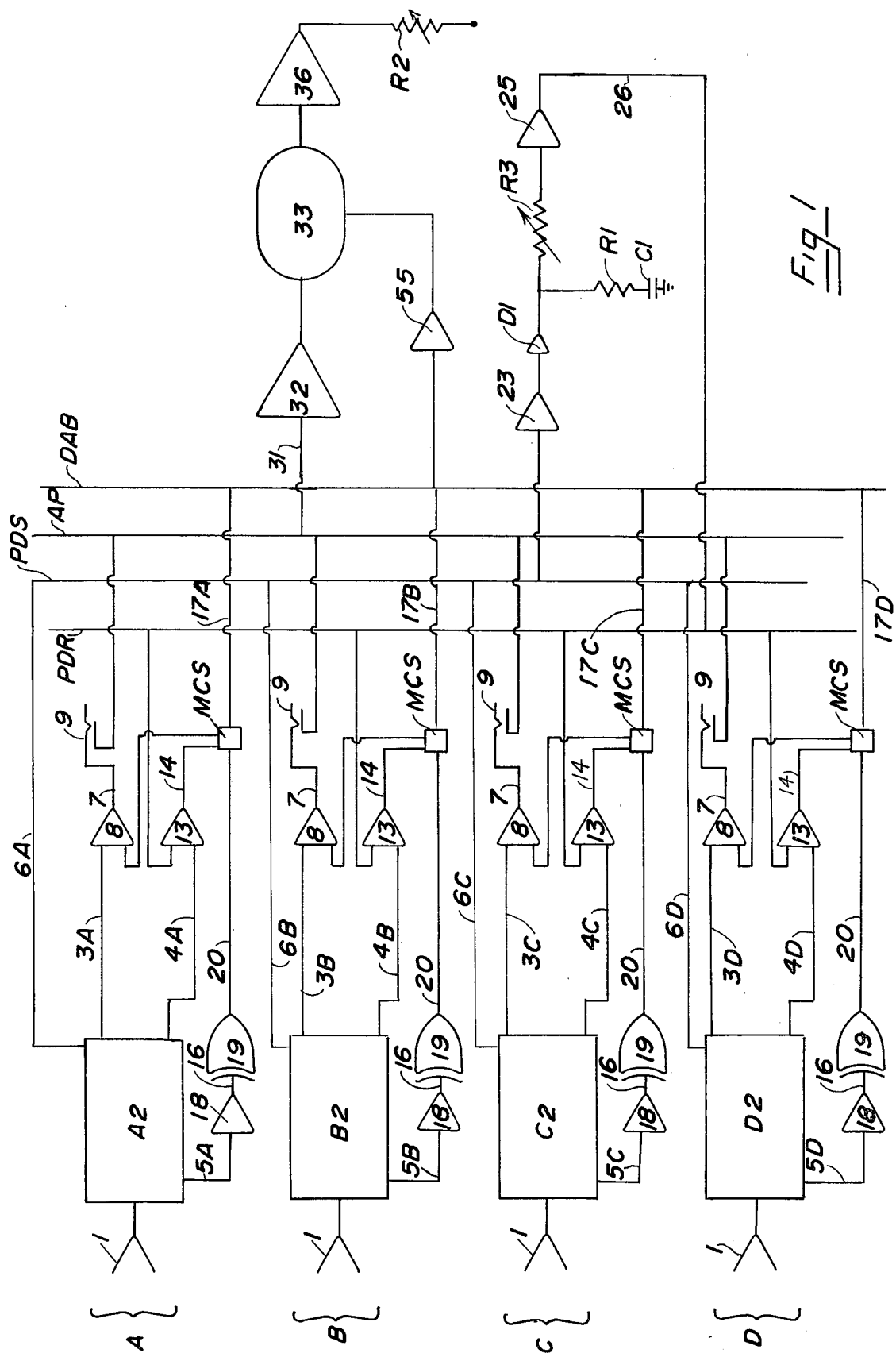
FIG. 1 is a partially schematic block diagram illustrating multiple input channel 1 and the associated output channel.

Referring first to FIG. 1, an arrangement is shown where 4 input channels A–D are shown, each having an audio program transducer 1 such as a microphone. Rectifier and filter circuits A2–D2 are provided and described hereinafter each having outputs 3A–5A through 3D–5D. Examples of rectifier and filter circuits A2–D2 are shown in detail in FIGS. 2 and 3. Program outputs 3A–3D are provided from each circuit A2–D2 and supplied to a program op amp 8 for example Signetics Part No. NE5532 to be actuated as described hereinafter to provide a program output 7. Direct output jacks 9 can be provided in each output 7 as shown.

A second output 4A–4D from each input channel filter circuit A2–D3 provides a modified, rectified and integrated DC signal which is reflective of the program signal as described hereinafter. The modified program signal from each output is provided to the inverting input of the comparator 13 for example a Signetics (TM) Part No. NE5532.

As explained hereinafter comparator 13 is provided to compare a reference signal described hereinafter with the modified program signal to selectively supply a digital signal from an output 14 of comparator 13 to a master control switch MCS, for example a type "D" flip-flop 65 as is known in the art. One switch MCS is provided in each input channel to selectively actuate the program op-amp upon receipt of a program signal of selected characteristics as described hereinafter.

Likewise outputs 5A–5D are provided from each circuit 2A–2D to supply an unrectified AC program signal to an amplifier 18 to supply a squared alternating current signal at output 16 which is representative of the frequency of the program signal to a "0" crossing detector 19 for example an exclusive "OR" gate to generate clock pulses as described hereinafter to the clock input of master control switch MCS in response to a "0" crossing of the squared program signal.

As described hereinafter one output 21 from master control switch MCS activates amplifier 8 which serves as a program switch when a program is received at microphone 1 at the time master control switch MCS is clocked by the pulse received from gate 19.

An output 17 of each master control switch MCS is provided to a digital attenuator buss DAB to provide a signal to a digital attenuator circuit for attenuating the output from the system as described hereinafter in FIG. 2.

A program Discriminator Send Buss PDS is provided to receive the filtered and rectified program signal from output 6A–6D of each actuated channel A2–D2.

As described in more detail hereinafter the direct current signals from each output 6A-6D are summed on buss PDS and attenuated through a summing amplifier 23 in a series through a diode D1 and capacitive resistor filter C1, R1 and variable resistor R3 to a driver 25 for example National LM324 ¼ of a Quad op amp which provides a reference signal at output 26 selectively reflective of the sum of the direct current signals provided by outputs 6A-6D.

Output 26 from driver 25 supplied to a program discriminator reference buss PDR where an input 22 is supplied for each comparator 13 of each input channel A-D as a reference to compare the signal at output 4A-4D and of the particular channel with the reference input 22. As described hereinafter, when the relationship between input signal 4A-4D channel and input 22 is within a selected preset relationship comparator 13 provides an actuating signal for the activated input channel A-D at output 14 which, as previously described is supplied to the master control switch MCS to allow the program to be transmitted by amplifier 8.

The program signal from each output 3A-3D is supplied through switching amplifier 8 of each channel 2A-2D to an audio program buss AP. As shown in the figures, the summed signals from buss AP are transmitted by lead 31 by an amplifier 32 to a digital attenuator 33 to provide an attenuated mixed program output 34 in response to the number of active channels A2-D2. Attenuator 33 can, for example be of the type shown in co-pending Application Ser. No. 4,195, filed Jan. 17, 1979. Attenuation is achieved as a function of the combined signal on buss DAB is reflective of the number of activated channels as described in more detail hereinafter. Output 34 from attenuator 33 is then supplied through an audio amplifier 36 and variable resistor R2 to an output 37.

Figure 2:
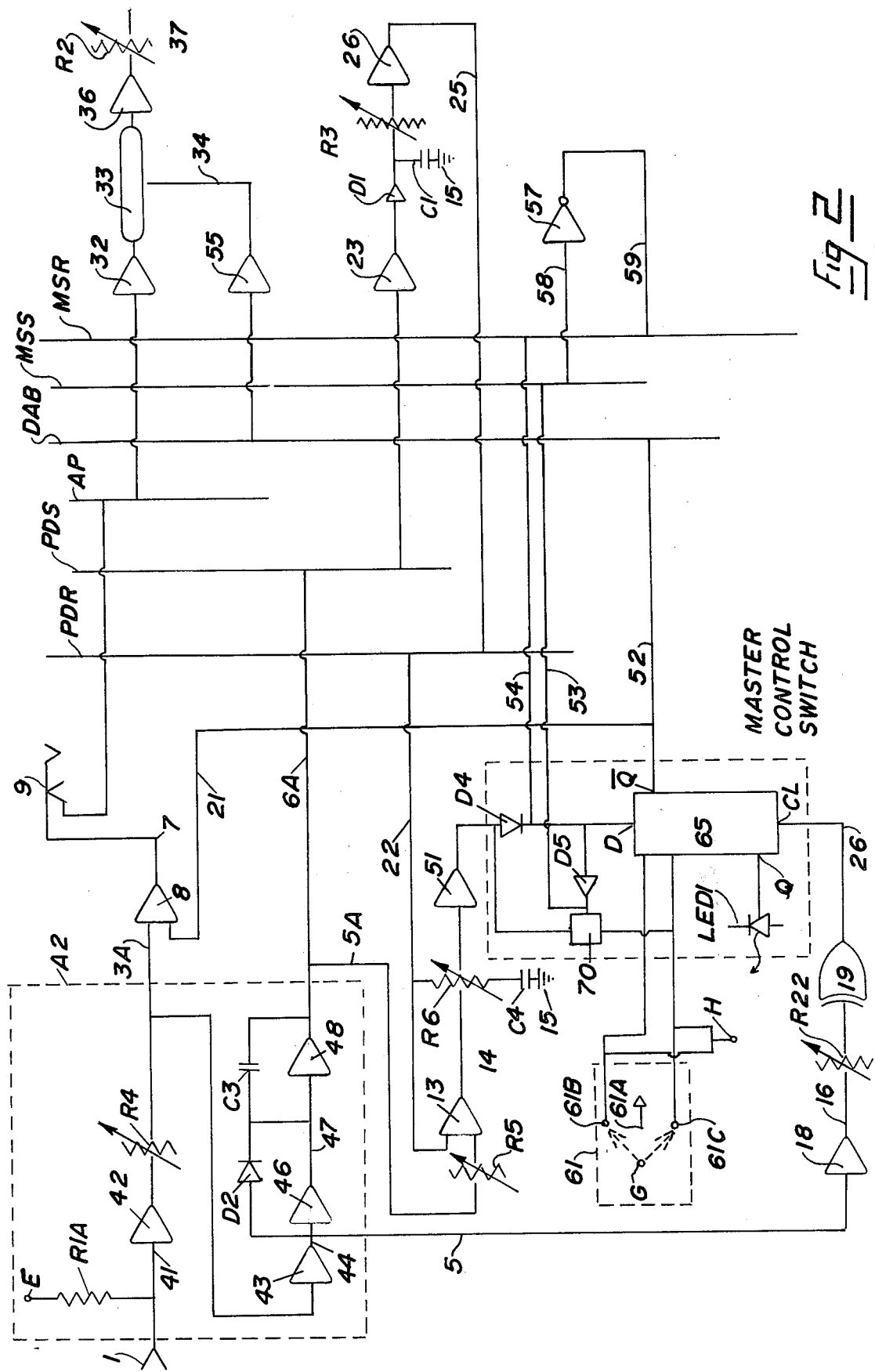
FIG. 2 is a more detailed schematic block diagram of one input channel and the associated common output channel.

Referring now to FIG. 2 which illustrates one input channel for example channel A of FIG. 1 in more detail, one arrangement of circuit A2 is shown within dotted lines, with several additional features within the scope of the present invention.

As shown, microphone 1 which is located to receive an audio program from a selected source (not shown) has an output 41 through a pullup resistor R1A supplied by voltage source E for example +48 VDC to a preamplifier 42 of selected gain. Output 3A of preamplifier 42 provides an output signal through a rheostat R4 to amplifier 8 and to an equalizer or bandpass filter 43 for example a National Semiconductor operational amplifier part No. LM 324N to provide modified response or rise for example a 3DB/octive rise at output 44 over a wide range of input frequencies, for example 10 to 5000 cycles per second so that the cutoff frequency is slightly in excess of 5000 cycles per second.

Alternating current output signals are supplied from output 44 to a full wave rectifier arrangement including a diode D2 in a feedback loop with an amplifier 46 for example a Signetics operational amplifier Part No. LN324N to provide a rectified direct current at output 47 which is supplied to an integrator including an amplifier 48 with feedback loop with capacitor C3 to provide a relatively smooth direct current signal at output 5A at a DC voltage reflecting the program input to microphone 1 which is supplied to buss PDS to be combined with like signals from other activated channels to provide a composite DC signal which reflects the totality of the intensity of the program input at any one time.

The use of a DC signal is found to be advantageous to avoid signal cancellation which occurs if an AC signal is used. Output 5A is also supplied through an attenuating rheostat R5 to the noninverting input of comparator 13 to compare the DC voltage level of output 5A with the reference voltage on buss PDR supplied by all active input channels A-D.

An actuating digital output signal is provided at output 14 through potentiometer R6 to buffer 51 provided to isolate comparator 13 from controller MCS which can contain logic device 65, for example a type D flip-flop.

The $\overline{Q}$ output of controller logic device 65 is provided to buss DAB and through output 21 to amplifier 8 to selectively initiate transmission of the audio program received by microphone 1 by means of output 7 to buss AP in response to the signal from output $\overline{Q}$. At the same time the output signal provided at $\overline{Q}$ is supplied by means of lead 52 along with similar signals from the other actuated input channels through summing amplifier 55 to provide an input signal to digital attenuator 33 reflective of the total number of actuated input channels.

The attenuated program which includes the program signals from all active input channels, is supplied from digital attenuator 33 to an amplifier 36 and variable volume control resistor R2 to output 37, for example to a speaker system, tape recorder or other device, not shown.

Within the scope of the present invention selected input channels can be provided with priority controls illustrated schematically in FIG. 2. As shown in more detail in FIG. 3, but referring to FIG. 2 a master buss signal inverter 57 is provided to be connected in series between Master Select Send buss MSS and Master Select Return buss MSR.

A priority switch 61 can be provided for selected input channels to provide local control. Switch 61 is normally open but has terminal 61B and 61C to be selectively contacted by contactor 61A which is supplied by a selected voltage source G for example +8 VDC. Terminals 61B and 61C are connected to a bias voltage source H, for example 8 VDC and terminal 61B is connected to reset terminal R of device 65 while terminal 61C is connected to operate a switch 70, which is part of master control switch MCS as described hereinafter, upon closure of contractor 61A on terminal 61C.

Closure of contactor 61A on terminal 61C closes switch 70 to improve disability signal on other input channels and provide exclusive access as described hereinafter.

Terminal 61B of switch 61 is connected to reset terminal R of device 65 and so when contactor 61A is closed on terminal 61C a positive signal is applied to reset terminal R which is then transmitted to terminal D to actuate switching amplifier 8 to permit access to the output regardless whether the program input would be sufficient to provide access.

Figure 3:
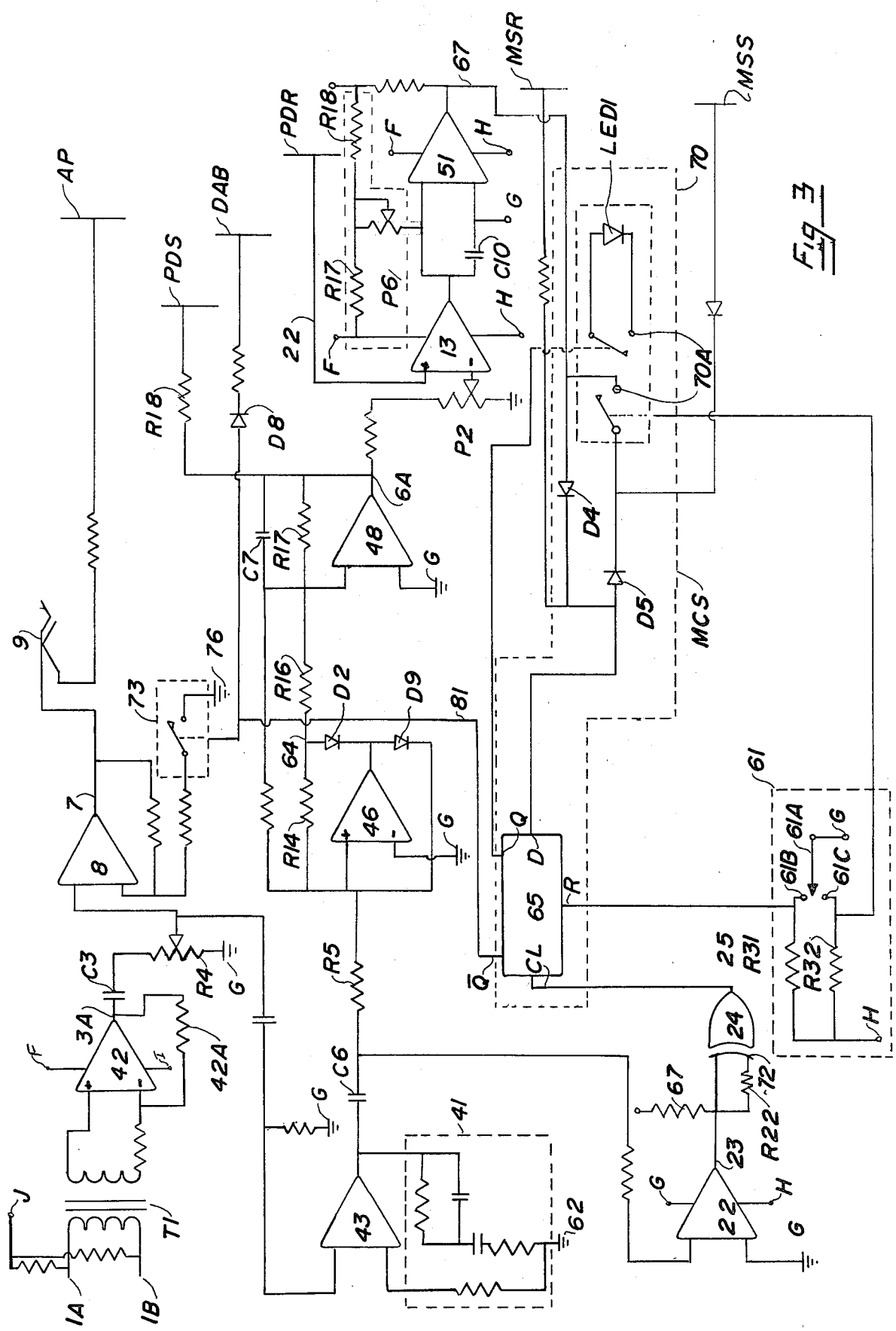
FIG. 3 is a detailed schematic diagram of the input channel of FIG. 2.

Referring now to FIG. 3, which shows a detailed schematic diagram of one channel as shown in FIG. 2, the inputs 1A, 1B of microphone 1 are connected through a matching transformer T1 to the input of preamplifier 42 which has a fixed gain loop 42A. A coupling capacitor C3 is provided at output 3A in a series with microphone gain potentiometer R4 ground at 61 to the noninverting input of equalizer 43. Equalizer 43 as previously described is a bandpass filter with feedback circuit 41 connected to ground 62 as known in the art to provide selected signal frequency response. Output 63 of equalizer 43 is connected through a coupling capacitor C6 to the noninverting input of squaring amplifier 22 and through resistor R5 to the noninverting input of op amp 46. Op amp 46 is provided with dual feedback including diodes D2 and D9 and resistor R14 as shown to provide a full wave rectified DC signal at output 64 which simulates the input signal of the input to op amp 46. Output 64 is connected to the inverting input of an op amp 48 which is provided with a feedback loop including capacitor C7 and resistor R17 to provide an integrated signal at output 6A which is supplied through resistor R18 to buss PDS and through potentiometer P2 to the inverting input of comparator 13. As previously described the noninverting input is connected to buss PDR by means of lead 22 to provide the reference signal. Output 14 of comparator 13 is connected between inputs of buffer 51 where a voltage divider potentiometer P6, shown within the dotted lines, is provided to supply release voltage for buffer 51 and supplied by pullup sources F (for example +15 VDC) and G (for example +8 VDC) through resistors R17 and R18 of selected value.

Buffer 51 is provided as is known in the art to isolate master control switch MCS from comparator 13 where output 14 from comparator 13 is connected to an input network with a potentiometer P6 connected between B+ pullups F and G series with resistor R17.

Figures 5A, 5B, 5C:
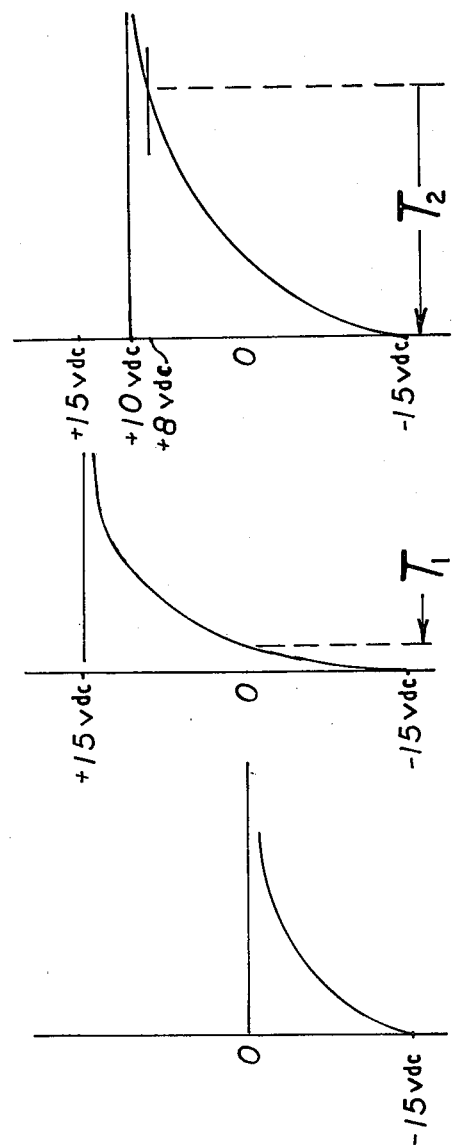
FIGS. 5a–5c is a graphic illustration of the operation of a buffer circuit.

In the arrangement shown in FIG. 3 the release for buffer 51 is determined by the relative values of capacitor C10 and potentiometer P6 between resistors R17 and R18 connected between voltage sources F, for example +15 VDC, and G, for example +8 VDC to apply a selected voltage to input of buffer 51 where the input voltage is divided by resistor R17 and R18. Source G is also connected across to the input to buffer 51 so the arrangement shown permits the use of a relatively inexpensive capacitor C10 to provide generally three times the time constant otherwise available as illustrated in FIGS. 5a–5c. For example, FIG. 5a is an illustration of the characteristic discharge of a capacitor discharging to 0 where the discharge is asymptotic to 0 so that there is no clearcut cutoff point.

FIG. 5b illustrates an arrangement illustrating characteristics discharge between +15 VDC and −15 VDC where the release occurs at 0 crossing. Because of the rapid rise the discharge time T1 is low.

FIG. 5c is an illustration of the discharge characteristics of the advantageous arrangement within the scope of the present invention where the release occurs at the voltage set by source G, for example +8 VDC and capacitor C10 discharges from −15 VDC to +8 VDC provided by potentiometer P6 and voltage divider R17, R18 so that the release accrues at a time +T2, which is three times the period +T1 so that by the use of the resistor pair and potentiometer P6 a less expensive capacitor C10 can be used. Output 67 of buffer 51 is connected through resistor R20 to "D" input of logic device 65.

As previously described square wave amplifier 22 is provided to supply an AC square wave output 23 to an Exclusive OR gate 24, through resistor 67 to pullup G.

Figure 4A:
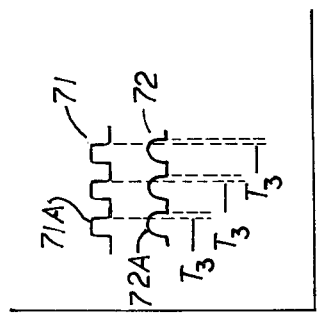
FIGS. 4a–4b illustrate one example of actuating pulses.

To provide an output pulse at output 25, output 23 is connected to pullup G and through both leads 71 and 72 to Exclusive OR gate 24 where lead 72 includes a delay resistor R22. The inputs 71 and 72 to exclusive OR gate 24 are as shown in FIG. 4A and represented respectively by curves 71A and 72A. The full rise of curve 72 is rounded and slightly delayed by a selected time T3 by virtue of resistor R22 as illustrated in FIG. 4a so that for the period T3 the inputs received by Exclusive OR gate 24 are different.

Figure 4B:
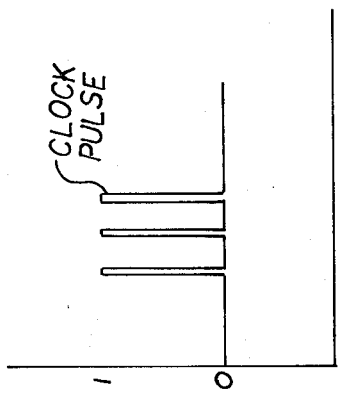

During this period the output 25 of Exclusive OR gate 24 is positive and then reverts to negative (or 0) when input reaches the curves 71A and 72A rises so that a positive signal is periodically supplied to the clock input CL of logic device 65 for the time period T3 as shown in FIG. 4B.

Turning now to logic device 65 for example a dual D type flip-flop Signetics Part No. 4012 the input D receives the digital signal from the output 67 of comparator 13 through buffer 51 supplied through a diode D4 as described hereinafter.

Thus as is known in the art, upon receipt of a pulse at Clock input CL the signal received at input D is transmitted to output Q and a reciprocal signal is present at output $\overline{Q}$.

Output $\overline{Q}$ is connected by lead 81 to provide a digital signal to activate a switch 73 for example COS/MOS bilateral switch RCA part No. CD4066 AD and by means of a lead 74 through diode D8 to provide a digital signal to buss DAB. Switch 73 which is normally open, upon activation closes to ground 76 and to provide feedback gain to amplifier 8 to activate amplifier 8 to transmit the program signal received a microphone 1 to buss AP.

As previously briefly described a manual selector switch 61 provides input channel access to the output regardless of the status of other input channels. As shown switch 61 includes an arm 61A connected to a positive voltage source arm 61A connected to a positive voltage source G, for example +8 VDC.

A negative voltage source H, for example −8 VDC is provided at terminal 61B and 61C to provide a negative bias until closure of arm 61A on the terminals.

When switch 61 is open, in the position shown the input channel is in automatic actuation and input channels operate as previously described. However arm 61A can be moved to contact terminals 61B or 61C to give the particular input channel priority. Terminal 61B is selectively connected through a positive voltage source G for example +8 VDC to reset terminal R of master control MCS so that a negative bias is normally imposed on terminal R until contact with arm 61B a positive signal is imposed on terminal R which provides a positive signal at output $\overline{Q}$ regardless of the input channel amplifier 8 so that the input channel is on regardless of whether a program is received.

Likewise a master control arrangement is provided where arm 61A is closed on terminal 61C so that a positive signal is imposed on switch 70 to close contacts 70A to impose a signal on input D which, through output $\overline{Q}$ actuates amplifier 57 and imposes a disabling signal on buss SS which is imposed on all other channels except those with actuated priority switches to disable them.

It will be understood that the foregoing is but one example of an arrangement within the scope of the present invention and that various other arrangements within the scope of the present invention will occur to those skilled in the art upon reading the disclosure set forth herein.

The invention claimed is:

1. A multiple input signal transmission means including:

(a) at least two signal input channels, each channel including:
  (i) program input signal generating means to generate an alternating current first program output signal in response to receipt of an input signal;
  (ii) rectifier means to receive said alternating current first program signal and provide a direct current first program signal;
  (iii) comparator means to receive said direct current first program signal and a direct current reference signal and to generate first and second actuator signals in response to selected differences between said direct current first program signal and said reference signal;
  (iv) input channel master control switch means to receive said first and second actuator signals and to generate a first master control output signal in response to receipt of said first actuator signal and to generate a second master control output signal in response to receipt of said second actuator signal and transmit one of said first and second master control output signals upon receipt of a master control switch initiator signal;
  (v) program switch means to receive said first program output signal and said first and second master control output signals to provide a first program output signal upon receipt of said first master control output signal and to provide a second program output signal upon receipt of said second master control output signal;
  (vi) "0" crossing detector means to receive said first alternating current program output signal and to generate said master control switch initiator signal upon occurrence of "0" voltage in said first program signal and to couple said master control switch initiator signal to said master control switch to permit transmission of one of said first and second master control switch signals;
(b) collector buss means to receive said direct current first program signal from selected input channels and generate said reference signal and supply said reference signal to said comparator means of each input channel;
(c) attenuator means to receive said second program output signals and said master control output signals from at least two of said master control switch means and, attenuate said second program signals as a function of said control output signals and transmit combined and attenuated second program output signals to output means.

2. The invention of claim 1 wherein said comparator means generates said first actuator signal when the voltage of said direct current first program signal is greater than the voltage of said reference signal.

3. The invention of claim 1 including filter means to receive said program output signal to supply a filtered signal to said rectifier means.

4. The invention of claim 1 including signal buffer means to receive said actuator signals from said comparator means where said buffer means includes resistor means to bias said first and second actuator signals to extend cutoff time and where the output signal from said buffer means provides said actuator signals to said master control switch.

5. The invention of claim 4 wherein said actuator signals and said first and second master control output signals are of the same polarity.

6. The invention of claim 4 wherein said actuator signals and said first and second master control signals are of opposite polarity.

7. The invention of claim 4 wherein said master control switch includes override means to permit actuation of said program switch means regardless of the state of operation of said comparator means.

8. The invention of claim 1 wherein said input channel master control switch includes first input means to receive said actuator signals, and first output means to transmit said actuator signals as said first and second master control output signals where said master control switch also includes second input means to receive said initiator signal and control means to transfer a function of said actuator signal to said first output means upon receipt of said initiator signal.

9. The invention of claim 1 wherein said "0" crossing detector means includes half wave rectifier means to receive said first program output signal and provide a half wave rectified first program output signal, first and second "0" crossing input means each to receive said half wave rectified first program output signal, signal transmission delay means in one of said first and second "0" crossing input means, voltage detection means to provide said master control switch initiator signal when the voltage at only one of said first and second "0" crossing input means is "0".

10. The invention of claim 1 including signal damper means to apply a selected reference signal to said collector buss to turn off selected input channels and provide access to said output means for selected input channels.

* * * * *